United States Patent
Shimizu

(10) Patent No.: US 12,451,465 B2
(45) Date of Patent: Oct. 21, 2025

(54) SEMICONDUCTOR DEVICE

(71) Applicant: Mitsubishi Electric Corporation, Tokyo (JP)

(72) Inventor: Yasutaka Shimizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 532 days.

(21) Appl. No.: 17/930,934

(22) Filed: Sep. 9, 2022

(65) Prior Publication Data

US 2023/0343748 A1 Oct. 26, 2023

(30) Foreign Application Priority Data

Apr. 21, 2022 (JP) ................................ 2022-070196

(51) Int. Cl.
*H01L 23/00* (2006.01)
*H01L 23/538* (2006.01)
*H01L 25/065* (2023.01)

(52) U.S. Cl.
CPC ...... *H01L 25/0655* (2013.01); *H01L 23/5386* (2013.01); *H01L 24/48* (2013.01); *H01L 24/49* (2013.01); *H01L 2224/48227* (2013.01); *H01L 2224/48465* (2013.01); *H01L 2224/49175* (2013.01)

(58) Field of Classification Search
CPC . H01L 25/0655; H01L 23/5386; H01L 24/48; H01L 24/49; H01L 2224/48227; H01L 2224/48465; H01L 2224/49175; H01L 23/5227; H01L 25/072; H01L 23/49844; H01L 25/18
See application file for complete search history.

(56) References Cited

U.S. PATENT DOCUMENTS

| | | |
|---|---|---|
| 2002/0038873 A1 | 4/2002 | Hiyoshi |
| 2017/0170157 A1* | 6/2017 | Masuda ................. H01L 24/49 |
| 2021/0143093 A1 | 5/2021 | Ichikawa |

FOREIGN PATENT DOCUMENTS

| | | |
|---|---|---|
| JP | 2002-110905 A | 4/2002 |
| WO | 2016/009496 A1 | 1/2016 |
| WO | 2020/170553 A1 | 8/2020 |

OTHER PUBLICATIONS

"Notice of Reasons for Refusal" Office Action issued in JP 2022-070196; mailed by the Japanese Patent Office on Jan. 7, 2025.

* cited by examiner

*Primary Examiner* — Elias Ullah
(74) *Attorney, Agent, or Firm* — Studebaker Brackett PLLC

(57) ABSTRACT

A semiconductor device includes: a first circuit pattern having a recessed part in a planar view; a second circuit pattern positioned in the recessed part; a plurality of semiconductor chips bonded onto the first circuit pattern; and wires connecting top electrodes of the plurality of semiconductor chips to the second circuit pattern, wherein a width of the second circuit pattern increases from upstream to downstream on a current path by which a current flows through the second circuit pattern, and the first circuit pattern has a step in a planar view on a side of the recessed part, and a width of the recessed part increases in a tiered way to match an increase in the width of the second circuit pattern.

9 Claims, 4 Drawing Sheets

SEMICONDUCTOR DEVICE

BACKGROUND OF THE INVENTION

Field

The present disclosure relates to a semiconductor device.

Background

To prevent thermal concentration, it has been proposed to arrange semiconductor chips and bonding wires of upper and lower arms so as to possess point symmetry with respect to a central point of a semiconductor device (for example, see WO/2020/170553).

SUMMARY

When arranging a plurality of semiconductor chips, there is a problem in that pinpointing the chip mounting positions is difficult and manufacturability worsens.

The present disclosure has been devised to address problems like the above, and an objective thereof is to obtain a semiconductor device of which the manufacturability can be improved.

A semiconductor device according to the present disclosure includes: a first circuit pattern having a recessed part in a planar view; a second circuit pattern positioned in the recessed part; a plurality of semiconductor chips bonded onto the first circuit pattern; and wires connecting top electrodes of the plurality of semiconductor chips to the second circuit pattern, wherein a width of the second circuit pattern increases from upstream to downstream on a current path by which a current flows through the second circuit pattern, and the first circuit pattern has a step in a planar view on a side of the recessed part, and a width of the recessed part increases in a tiered way to match an increase in the width of the second circuit pattern.

In the present disclosure, the first circuit pattern has a step in a planar view on a side of the recessed part, and a width of the recessed part increases in a tiered way to match an increase in the width of the second circuit pattern. When bonding the semiconductor chips onto the first circuit pattern, the chip mounting positions can be pinpointed by referring to the step as a guide, and therefore manufacturability can be improved.

Other and further objects, features and advantages of the invention will appear more fully from the following description.

DESCRIPTION OF EMBODIMENTS

A semiconductor device according to the embodiments of the present disclosure will be described with reference to the drawings. The same components will be denoted by the same symbols, and the repeated description thereof may be omitted.

First Embodiment

Figure 1:
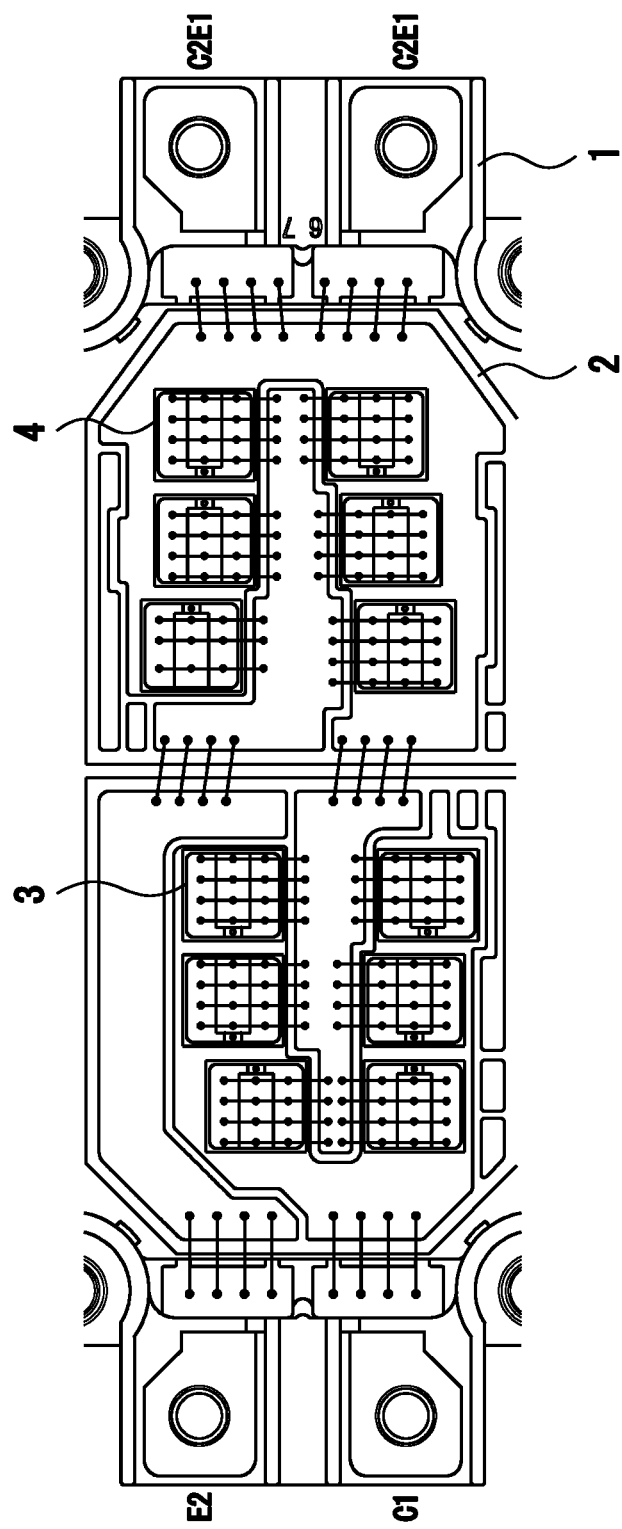
FIG. 1 is a plan view of a semiconductor device according to a first embodiment.
Figure 2:
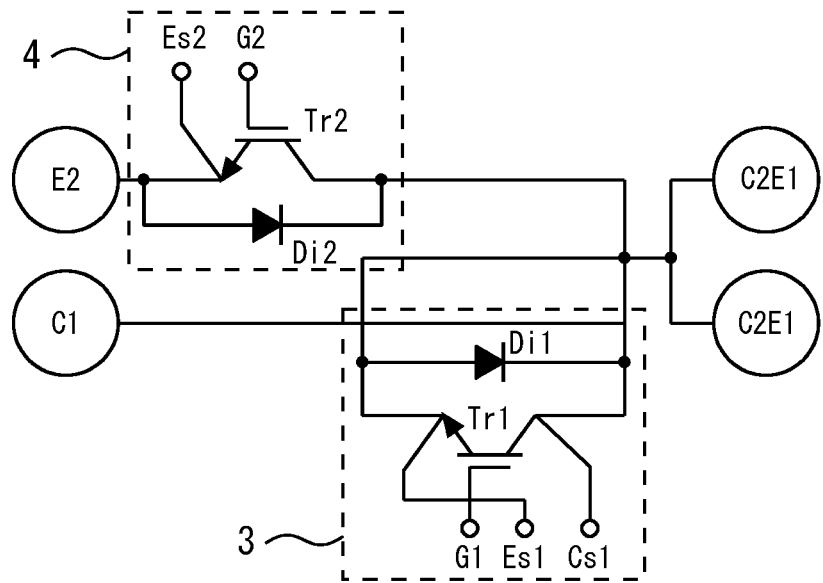
FIG. 2 is a circuit diagram of the semiconductor device according to the first embodiment.

FIG. 1 is a plan view of a semiconductor device according to a first embodiment. FIG. 2 is a circuit diagram of the semiconductor device according to the first embodiment. An insulating substrate 2 is provided inside a case 1. A plurality of semiconductor chips 3 and a plurality of semiconductor chips 4 are provided on top of the insulating substrate 2. The collectors of the semiconductor chips 3 are connected to an electrode C1 of the case 1. The emitters of the semiconductor chips 3 and the collectors of the semiconductor chips 4 are connected to an electrode C2E1. The emitters of the semiconductor chips 4 are connected to an electrode E2. Note that, although omitted from illustration in the diagrams, the interior of the case 1 is encapsulated by an encapsulation material, and a lid is provided above the case 1.

The semiconductor chip 3 includes a switching device Tr1 and a flyback device Di1 integrated into a single device and connected in anti-parallel. The semiconductor chips 4 includes a switching device Tr2 and a flyback device Di2 integrated into a single device and connected in anti-parallel. Integrating two elements into a single device in this way contributes to size reduction. The switching devices Tr1 and Tr2 are IGBTs, for example, but may also be MOSFETs or the like.

Figure 3:
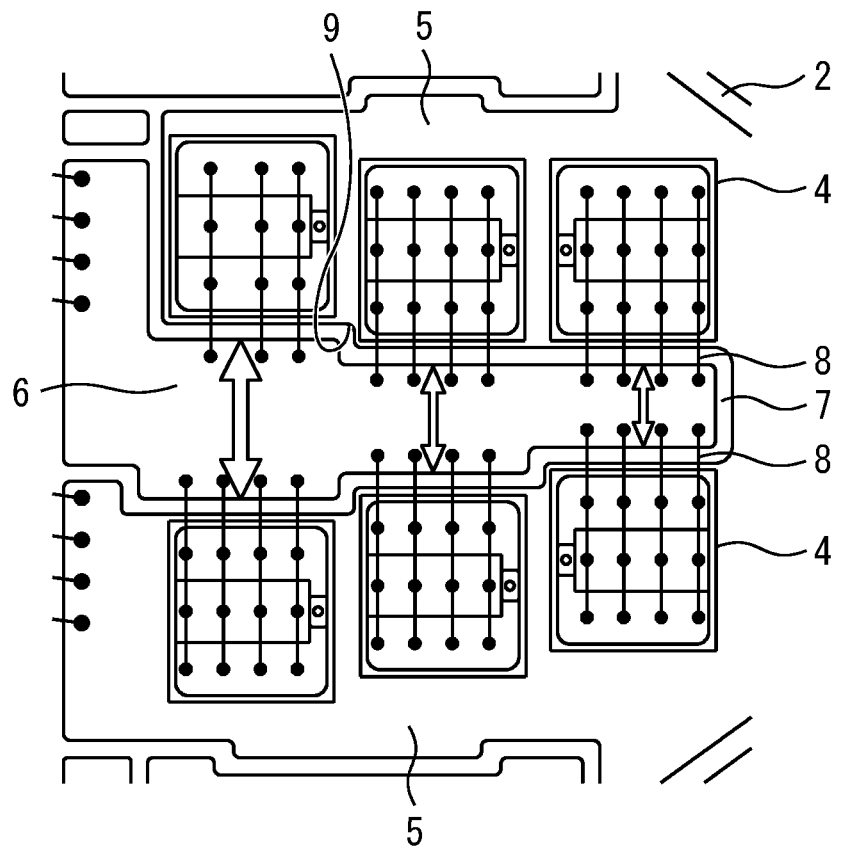
FIG. 3 is an enlarged plan view of a portion of the semiconductor device according to the first embodiment.

FIG. 3 is an enlarged plan view of a portion of the semiconductor device according to the first embodiment. A first circuit pattern 5 and a second circuit pattern 6 are provided on the upper surface of the insulating substrate 2. The first circuit pattern 5 has a recessed part 7 in a planar view. The second circuit pattern 6 is positioned in the recessed part 7.

The plurality of semiconductor chips 4 are arranged along the sides of the recessed part 7 and bonded onto the top of the first circuit pattern 5. Pairs of two semiconductor chips 4 face each other across the recessed part 7. Top electrodes of the semiconductor chips 4 are the emitter electrodes and are connected to the second circuit pattern 6 by wires 8. Bottom electrodes of the semiconductor chips 4 are the collector electrodes and are soldered or otherwise connected to the second circuit pattern 6. Consequently, the plurality of semiconductor chips 4 are connected to each other in parallel.

A current flowing out from the emitters of the plurality of semiconductor chips 4 flows from the right side to the left side of the second circuit pattern 6 in FIG. 3, and then flows to the electrode E2 in FIG. 1. The width of the second circuit pattern 6 increases from upstream to downstream on the current path by which a current flows through the second circuit pattern 6. Consequently, a voltage drop due to a large current flowing through the second circuit pattern 6 increases from upstream to downstream on the path. With this arrangement, the parasitic inductance can be equalized, thereby making it possible to balance electrical characteristics among the chips. Furthermore, the size of the device can be reduced thanks to the small pattern width upstream.

In addition, the first circuit pattern 5 has steps 9 in a planar view on the sides of the recessed part 7, and the width of the recessed part 7 increases in a tiered way to match increases in the width of the second circuit pattern 6. When bonding the semiconductor chips 4 onto the top of the first circuit pattern 5, the chip mounting positions can be pinpointed by referring to the steps 9 as a guide, and therefore manufacturability can be improved. Note that the steps 9 are not required to exist between all of the semiconductor chips 4. Providing the steps 9 on both sides of the recessed part 7 is not essential, and the steps 9 may also be provided on only one side.

Additionally, the wires 8 connected to each of the paired semiconductor chips 4 on either side of the recessed part 7 are wire-bonded in straight lines. This arrangement minimizes the wire length, thereby making it possible to suppress temperature rises in the wires 8.

Moreover, the paired semiconductor chips 4 on either side of the recessed part 7 are positioned symmetrically with the second circuit pattern 6 in the center. With this arrangement, the wiring inductance can be balanced between the two chips, and noise in the semiconductor device can be reduced.

Second Embodiment

Figure 4:
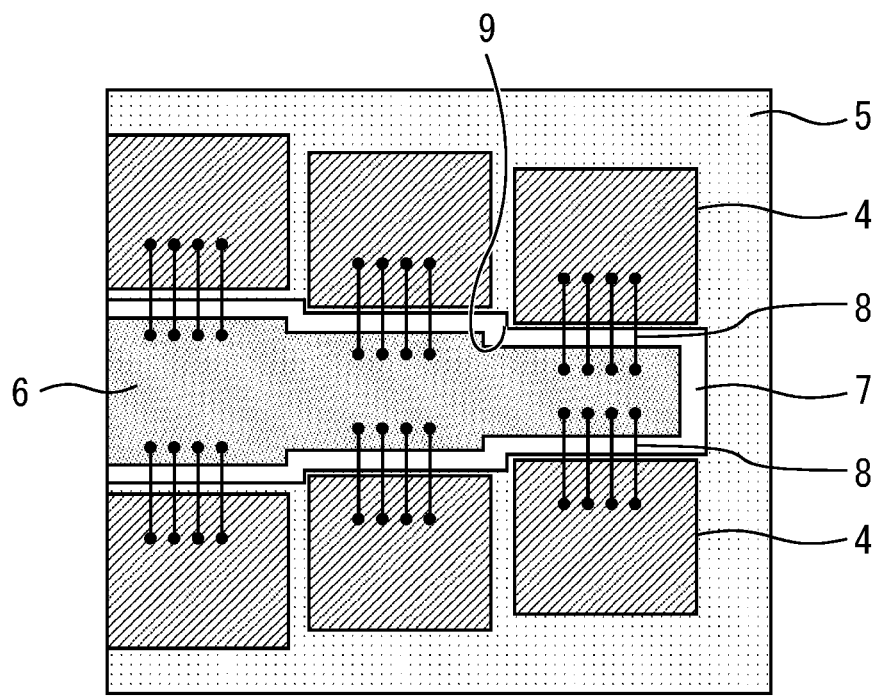
FIG. 4 is a plan view of a semiconductor device according to a second embodiment.

FIG. 4 is a plan view of a semiconductor device according to a second embodiment. If adjacent semiconductor chips 4 are bonded at an incline to each other, heat dissipation and reliability will be affected. In contrast, in the present embodiment, the steps 9 are positioned between each of the adjacent semiconductor chips 4. Consequently, by referring to the steps 9 as a guide when bonding the semiconductor chips 4, it is possible to prevent adjacent semiconductor chips 4 from being bonded at an incline.

Third Embodiment

Figure 5:
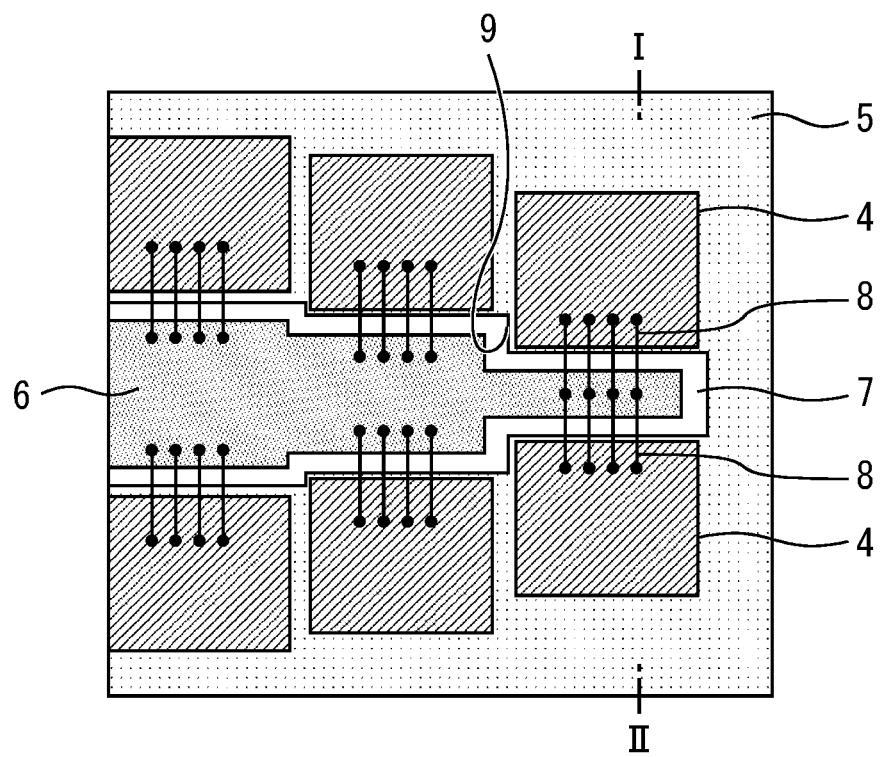
FIG. 5 is a plan view of a semiconductor device according to a third embodiment.
Figure 6:
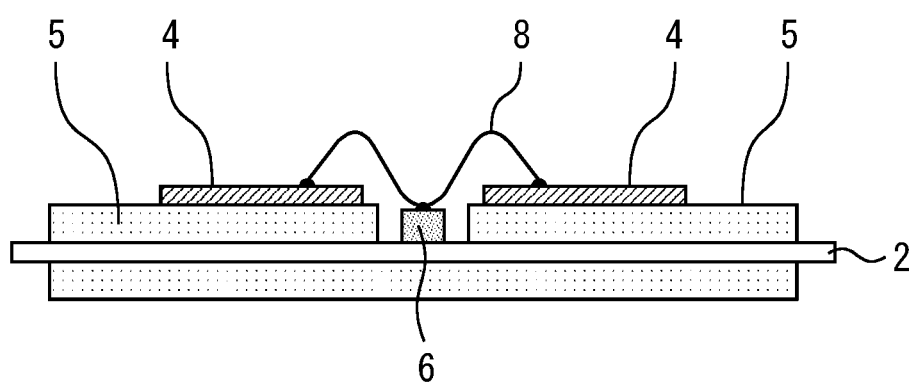
FIG. 6 is a cross section along the line I-II in FIG. 5.

FIG. 5 is a plan view of a semiconductor device according to a third embodiment. FIG. 6 is a cross section along the line I-II in FIG. 5. A single wire 8 is connected to each of the paired semiconductor chips 4 on either side of the recessed part 7 on the most upstream side of the current path, and stitched to the second circuit pattern 6 in only a single spot. With this arrangement, since there is one wire bonding spot on the second circuit pattern 6, the pattern width of the second circuit pattern 6 can be narrowed compared to the case where there are two wire bonding spots.

The semiconductor chips 3 and 4 are not limited to semiconductor chips formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

Although the preferred embodiments and the like have been described in detail above, the present disclosure is not limited to the above-described embodiments and the like, but the above-described embodiments and the like can be subjected to various modifications and replacements without departing from the scope described in the claims. Aspects of the present disclosure will be collectively described as supplementary notes.

(Supplementary Note 1)
A semiconductor device comprising:
a first circuit pattern having a recessed part in a planar view;
a second circuit pattern positioned in the recessed part;
a plurality of semiconductor chips bonded onto the first circuit pattern; and
wires connecting top electrodes of the plurality of semiconductor chips to the second circuit pattern,
wherein a width of the second circuit pattern increases from upstream to downstream on a current path by which a current flows through the second circuit pattern, and
the first circuit pattern has a step in a planar view on a side of the recessed part, and a width of the recessed part increases in a tiered way to match an increase in the width of the second circuit pattern.

(Supplementary Note 2)
The semiconductor device according to Supplementary Note 1, wherein the plurality of semiconductor chips are arranged along sides of the recessed part, and the step is positioned between the adjacent semiconductor chips.

(Supplementary Note 3)
The semiconductor device according to Supplementary Note 1 or 2, wherein one of the wires is connected to each of the paired semiconductor chips on either side of the recessed part on the most upstream side of the current path, and stitched to the second circuit pattern in only a single spot.

(Supplementary Note 4)
The semiconductor device according to any one of Supplementary Note 1 to 3, wherein the wires connected to the paired semiconductor chips on either side of the recessed part are wire-bonded in a straight line.

(Supplementary Note 5)
The semiconductor device according to any one of Supplementary Note 1 to 4, wherein the paired semiconductor chips on either side of the recessed part are positioned symmetrically with the second circuit pattern in the center.

(Supplementary Note 6)
The semiconductor device according to any one of Supplementary Note 1 to 5, wherein the semiconductor chip includes a switching device and a flyback device integrated into a single device.

(Supplementary Note 7)
The semiconductor device according to any one of Supplementary Note 1 to 6, wherein the plurality of semiconductor chips are formed of a wide-bandgap semiconductor.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2022-070196, filed on Apr. 21, 2022 including specification, claims, drawings and summary, on which the convention priority of the present application is based, is incorporated herein by reference in its entirety.

The invention claimed is:
1. A semiconductor device comprising:
a first circuit pattern having a recessed part in a planar view;
a second circuit pattern positioned in the recessed part;
a plurality of semiconductor chips bonded onto the first circuit pattern; and wires connecting top electrodes of the plurality of semiconductor chips to the second circuit pattern, wherein a width of the second circuit pattern increases from upstream to downstream on a current path by which a current is configured to flow through the second circuit pattern, the first circuit pattern has a step in the planar view on a side of the recessed part, and a width of the recessed part increases in a tiered way to match an increase in the width of the second circuit pattern, the second circuit pattern includes a first portion, a second portion wider than the first portion, and a third portion wider than the second portion, and the plurality of semiconductor chips include a first pair of semiconductor chips sandwiching the first portion and having upper electrodes wire-connected to the first portion, a second pair of semiconductor chips sandwiching the second portion and having upper electrodes wire-connected to the second portion, and a third pair of semiconductor chips sandwiching the third portion and having upper electrodes wire-connected to the third portion.

2. The semiconductor device according to claim 1, wherein the plurality of semiconductor chips are arranged along sides of the recessed part, and the step is positioned between two adjacent semiconductor chips among the plurality of semiconductor chips.

3. The semiconductor device according to claim 1, further comprising another plurality of semiconductor chips opposite to the plurality of semiconductor chips across the recessed part and each paired with a corresponding one of the plurality of semiconductor chips, wherein one of the wires is connected to each of the paired semiconductor chips on either side of the recessed part on the most upstream side of the current path, and stitched to the second circuit pattern in only a single spot.

4. The semiconductor device according to claim 1, further comprising another plurality of semiconductor chips opposite to the plurality of semiconductor chips across the recessed part and each paired with a corresponding one of the plurality of semiconductor chips, wherein the wires connected to the paired semiconductor chips on either side of the recessed part are wire-bonded in a straight line.

5. The semiconductor device according to claim 1, further comprising another plurality of semiconductor chips opposite to the plurality of semiconductor chips across the recessed part and each paired with a corresponding one of the plurality of semiconductor chips, wherein the paired semiconductor chips on either side of the recessed part are positioned symmetrically with the second circuit pattern in the center.

6. The semiconductor device according to claim 1, wherein the plurality of semiconductor chips include a switching device and a flyback device integrated into a single device.

7. The semiconductor device according to claim 1, wherein the plurality of semiconductor chips are formed of a wide-bandgap semiconductor.

8. The semiconductor device according to claim 1, wherein the second circuit pattern has another step in the planar view that has a width equal to a width of the step of the first circuit pattern.

9. The semiconductor device according to claim 1, wherein the plurality of semiconductor chips are bonded onto the first circuit pattern along a first direction, the width of the second circuit pattern is measured in a second direction perpendicular to the first direction, the width of the recessed part is measured in the second direction, and the step is positioned between two adjacent semiconductor chips among the plurality of semiconductor chips in the first direction.

* * * * *